United States Patent [19]

Tomomura et al.

[11] Patent Number: 5,055,363
[45] Date of Patent: Oct. 8, 1991

[54] ELECTROLUMINESCENT DEVICE OF COMPOUND SEMICONDUCTOR

[75] Inventors: Yoshitaka Tomomura, Saidaiji-higashimachi; Masahiko Kitagawa, Nara, Japan

[73] Assignee: Sarp Kabushiki Kaisha, Osaka, Japan

[21] Appl. No.: 382,239

[22] Filed: Jul. 19, 1989

[30] Foreign Application Priority Data

Jul. 21, 1988 [JP] Japan ............................. 63-182664
Sep. 26, 1988 [JP] Japan ............................. 63-240556

[51] Int. Cl.$^5$ ............................................. H01L 33/00
[52] U.S. Cl. .................................. 428/690; 313/506; 357/17; 428/901; 428/907
[58] Field of Search .................. 428/690, 99, 917; 357/17; 313/503, 506, 509, 512

[56] References Cited

U.S. PATENT DOCUMENTS

| 3,919,589 | 11/1975 | Hanak | 313/506 |
| 3,975,661 | 8/1976 | Kanatani | 357/17 |
| 4,634,934 | 1/1987 | Tohda et al. | 313/503 |
| 4,868,615 | 9/1989 | Kamata | 357/17 |
| 4,916,496 | 4/1990 | Tomomura et al. | 357/17 |

*Primary Examiner*—James J. Seidleck
*Attorney, Agent, or Firm*—Cohen, Pontani & Lieberman

[57] ABSTRACT

The present invention provides an electroluminescent device of a Group II–VI compound semiconductor which comprises a substrate, a light-emitting portion, and a conductive portion provided at least between the substrate and the light-emitting portion for injecting into the light-emitting portion the current to be produced in the device by the application of an external voltage.

16 Claims, 7 Drawing Sheets

ELECTROLUMINESCENT DEVICE OF COMPOUND SEMICONDUCTOR

BACKGROUND OF THE INVENTION

1. Field of the Invention

The present invention relates to electroluminescent devices of compound semiconductors, and more particulary to improvements in electroluminescent devices comprising a Group II–VI compound semiconductor such as zinc sulfide (ZnS) or zinc selenide (ZnSe).

2. Description of the Prior Art

Group II–VI compound semiconductors such as ZnS and ZnSe are generally used as materials for devices, such as blue light-emitting diodes, for producing light with high efficiency over the region of ultraviolet rays to visible rays.

FIG. 10 shows an example of structure conventionally used for electroluminescent devices of such a Group II–VI compound semiconductor. Indicated at 71 is a low-resistance n-type ZnS single-crystal substrate prepared from a ZnS bulk single crystal grown by the halogen chemical transport process, by heat-treating the crystal in molten zinc at 1000° C. for 100 hours. A light-emitting layer 74 of n-type ZnS and an insulating layer 75 of insulating ZnS are successively formed epitaxially over the substrate 71 by molecular beam epitaxy (MBE) or organometallic chemical vapor deposition (MOCVD). Gold (Au) is deposited on the insulating layer 75 by vacuum evaporation to form a positive electrode 77. An ohmic electrode of indium (In) serving as a negative electrode 78 is formed on the rear surface of the low-resistance n-type substrate 71. Thus, a MIS electroluminescent device is fabricated.

Also proposed is an electroluminescent device wherein a conductive layer is provided between a substrate and a light-emitting layer.

With reference to FIG. 11, the proposed device comprises a low-resistance n-type ZnS substrate 83 having a resistivity of 10 to 1 ohm-cm and a thickness of 300 to 1000 μm, a low-resistance n-type ZnS conductive layer 84 having a resistivity of $10^{-2}$ to $10^3$ ohm-cm and epitaxially formed over the substrate 83, for example, by MBE from ZnS with Al, Cl or the like added thereto, a low-resistance n-type ZnS light-emitting layer 85 and a ZnS high-resistance layer 86 which are formed successively over the layer 84, for example, by MBE, an ohmic electrode 82 formed on the rear surface of the substrate 83 by depositing In thereon by vacuum evaporation and heat-treating the deposit in a high-purity gas atmosphere at 450° C. for several seconds to several minutes, an electrode 87 formed on the high-resistance ZnS layer 86 by depositing Au thereon by vacuum evaporation, and lead wires 81 and 88 suitably arranged.

With these conventional electroluminescent devices, the current injected via the electrodes 77, 78 or 82, 87 flows through the device over a wide region, so that the current density in the light-emitting layer 74 or 85 is small. This makes it difficult to obtain luminescence with high brightness. Furthermore, the light produced by the emitting layer 74 or 85 radiates through the device in every direction. It is therefore likely that the light produced will not be taken out of the device efficiently.

Either one of the foregoing constructions of electroluminescent devices may be used for fabricating a monolithic display device which comprises a multiplicity of minute luminescent chips having a unit size of 100 μm and prepared by forming a minute discrete pattern on the substrate. When current is passed through the device, the majority of current loss occurs in the substrate. It is therefore likely that the device is high in the series resistance of the chips and has an impaired insulating property between the chips.

An object of the present invention, which has been accomplished in view of the foregoing situation, is to provide an electroluminescent device of a Group II–VI compound semiconductor adapted to produce light with high brightness.

SUMMARY OF THE INVENTION

The present invention provides an electroluminescent device of a compound semiconductor which comprises an electroluminescent device body formed on a substrate and providing a light-emitting portion and a conductive portion joined to the lower surface and/or the upper surface of the light-emitting portion, and a pair of electrodes for applying therethrough an external voltage to the body to cause electroluminescence, the conductive portion comprising a conductive layer formed of a Group II–VI compound semiconductor made to have a substantially low resistance by the addition of an impurity element, and a conductive layer part provided in the conductive layer and formed of the Group II–VI compound semiconductor having an impurity element added thereto at a higher concentration than the conductive layer, the conductive layer part having a width to restrict the path of current flow through the light-emitting portion.

Thus, the present invention provides an electroluminescent device of a Group II–VI compound semiconductor which comprises a substrate, a light-emitting portion, and a conductive portion provided at least between the substrate and the light-emitting portion for injecting into the light-emitting portion the current to be produced in the device by the application of an external voltage. The conductive portion comprises a conductive layer formed of a Group II–VI compound semiconductor made to have a substantially low resistance by the addition of an impurity element, and a conductive layer part provided in the conductive layer and formed of the Group II–VI compound semiconductor having an impurity element added thereto. The conductive layer part is made to have a higher impurity concentration than the conductive layer so that the current to be injected into the light-emitting portion can be confined to the conductive layer part which is lower than the layer in resistivity. Consequently, current of high density can be injected into the light-emitting portion to effect luminescence with high brightness.

The refractive index of the conductive portion having impurities added thereto increases with a decrease in the impurity concentration. Accordingly, the conductive layer and the conductive layer part are different in refractive index, with the result that the light produced by the light-emitting portion is confined to the conductive layer of the higher refractive index when passing through the conductive portion, making it possible to deliver the light from the device with a high efficiency.

DESCRIPTION OF THE PREFERRED EMBODIMENTS

Figure 1:
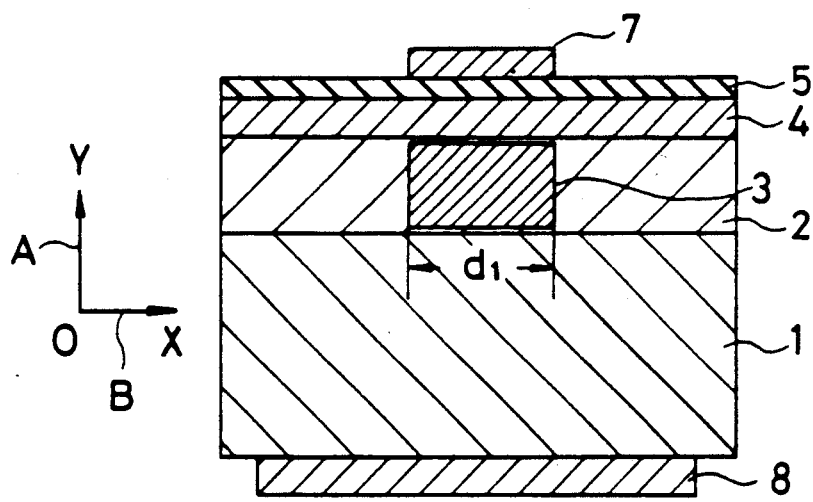
FIG. 1 is a diagram showing the structure of a first embodiment of the invention.

The electroluminescent device of the present invention is prepared from a Group II-VI compound semiconductor. The light emitted by the light-emitting portion by the application of a voltage across the electrodes has a multiplicity of colors including blue and appears on the upper surface or lower surface of the device. The device is used as a light source having high energy and high brightness for various displays, printers, facsimile systems, etc.

The greatest structural feature of the electroluminescent device of the invention is that the conductive portion joined to the lower surface and/or the upper surface of the light-emitting portion comprises a conductive layer (hereinafter referred to as the "first conductive layer") and a conductive layer part (hereinafter referred to as the "second conductive layer") provided in the first conductive layer, the second conductive layer having a higher impurity concentration than the first conductive layer.

The substrate for use in the invention is preferably made of a Group II-VI compound semiconductor. Examples of such semiconductors are low-resistance n-type ZnS, low-resistance n-type ZnSe, low-resistance n-type $ZnS_xSe_{1-x}$ and the like, and insulating ZnS, insulating ZnSe, insulating $ZnS_xSe_{1-x}$ and the like.

For example, the substrate of low-resistance n-type ZnS (or low-resistance n-type ZnSe or low-resistance n-type $ZnS_xSe_{1-x}$) is prepared from a ZnS bulk single crystal (or ZnSe bulk single crystal or $ZnS_xSe_{1-x}$ bulk single crystal) grown by the halogen chemical transport process, by heat-treating the single crystal in molten zinc at 1000° C. for about 100 hours. The substrate thus obtained is made to have a low resistance. Preferably, the above materials forming the substrate have the following resistivities (ohm-cm).

ZnS: 1 to 10, more preferably about 1.
ZnSe $10^{-2}$ to 10, more preferably about 1.
$ZnS_xSe_{1-x}$: 1 to 10, more preferably about 1.

Examples of n-type impurities useful for the heat treatment in preparing the substrates are Al, Ga and the like, Cl and Br. Also usable are In, I and the like.

For preparing the substrate of insulating ZnS (or insulating ZnSe or insulating $ZnS_xSe_{1-x}$), it is desirable to use a ZnS bulk single crystal (or ZnSe bulk single crystal or $ZnS_xSe_{1-x}$ bulk single crystal) as is without subjecting the crystal to low-resistance treatment.

When a $ZnS_{0.5}Se_{0.5}$ crystal which is grown by the halogen chemical transport process or high-pressure melting process is used, the substrate obtained is colored yellow or orange and is low in transparency for the luminescence wavelength, so that the blue light produced, for example, needs to be taken out from the semiconductor side. However, if a $ZnS_{0.5}Se_{0.5}$ crystal which is grown by the sublimation process is used, the resulting substrate is almost colorless and transparent and is desirable since blue light emitted can be taken out also from the substrate side. The substrate to be used in this case need not be subjected to the low-resistance treatment conventionally employed, but the wafer obtained from a bulk single crystal can be used as is, i.e. with its high resistivity (with insulating to semi-insulating property, $10^6$ to $10^{15}$ ohm-cm).

The light-emitting portion to be formed in the present invention is preferably an n-type ZnS light-emitting layer providing a ZnS electroluminescent device of the MIS (metal insulator semiconductor) type, or a light-emitting layer having a p-n junction provided by the combination of n-type ZnSe and p-type ZnSe for forming a p-n junction electroluminescent device of the planar structure type.

In the case of the MIS-type electroluminescent device, the Group II-VI compound semiconductor for the light-emitting layer is not limited to ZnS; also usable is, for example, ZnSe, $ZnS_xSe_{1-x}$ or $ZnS_yTe_{1-y}$. When the light-emitting layer is of the p-n junction type, use of a ZnSe p-n junction is not limitative; also usable are a ZnS p-n junction, a $ZnS_xSe_{1-x}$ p-n junction, a $ZnS_yTe_{1-y}$ p-n junction, p-n heterojunctions afforded by such materials, and various other junctions.

According to the present invention, the first conductive layer which is made to have a substantially low resistance by the addition of impurity means one having a resistivity of 1 to $10^{-2}$ ohm-cm. This resistivity is controllable by setting the concentration of impurity added to $10^{16}$ to $10^{18}$ at.cm$^{-3}$, whereby the electric resistance is settable to the range useful for electroluminescent devices.

On the other hand, it is desirable that the second conductive layer have a higher impurity concentration than the first conductive layer. More specifically, the impurity concentration of the second layer is greater than the first preferably by at least one order of magnitude.

Examples of n-type impurities for use in preparing the first and second conductive layers and the light-emitting layer are elements from Group III such as boron (B), aluminum (Al), gallium (Ga), indium (In) and thallium (Tl), and elements from Group VII such as chlorine (Cl), bromine (Br), fluorine (F) and iodine (I). At least one of these elements is used, or at least one of such elements from Group III is used in combination with at least one of these elements from Group VII. On the other hand, examples of useful p-type impurities are elements from Group Ia such as lithium (Li), sodium (Na), potassium (K), rubidium (Rb) and cesium (Cs), the elements from Group Ib, i.e. copper (Cu), silver (Ag) and Gold (Au), thallium from Group III and elements from Group V such as nitrogen (N), phosporus (P), arsenic (As), antimony (Sb) and bismuth (Bi). At least one of these elements is used, or at least one of the above elements from Group Ia or Ib is used in combination with at least one element from Group V. These impurities are suitable for giving epitaxial films which are small in their degree of compensation and have a high quality.

The first and second conductive layers and the n-type light-emitting layer of the invention have the impurity concentration E (cm$^{-3}$), resistivity R (ohm-cm) and thickness (height) L ($\mu$m) (see FIG. 1) given in Table 1 below.

TABLE 1

|  | E | R | L |
|---|---|---|---|
| First conductive layer | $10^{16}-10^{18}$ | $1-10^{-2}$ | 5-10 |
|  | $10^{18}$ | $5 \times 10^{-2}$ | 5 |
| Second conductive layer | $10^{17}-10^{19}$ | $10^{-1}-10^{-3}$ | 5-10 |
|  | $10^{19}$ | $5 \times 10^{-3}$ | 5 |
| n-Type light-emitting layer | $10^{15}-10^{18}$ |  | 0.5-5 |
|  | $10^{17}$ |  | 2 |

Note: The upper numerical ranges and the lower values listed in Table 1 for each layer are preferable ranges and more preferable values, respectively.

According to the invention, the expression that the second conductive layer has a width to restrict the path of current flow through the light-emitting portion means that the second conductive layer confines the current flowing into the light-emitting layer, such that the path of current flow through the light-emitting layer is limited to the portion thereof immediately above or below the second conductive layer, i.e., to a small region having a diameter (e.g. length $d_1$ in FIG. 1) in the widthwise direction (e.g. direction X indicated by arrow B in FIG. 1) perpendicular to the direction of height of the second conductive layer (e.g. direction Y indicated by arrow A in FIG. 1).

Figure 2:
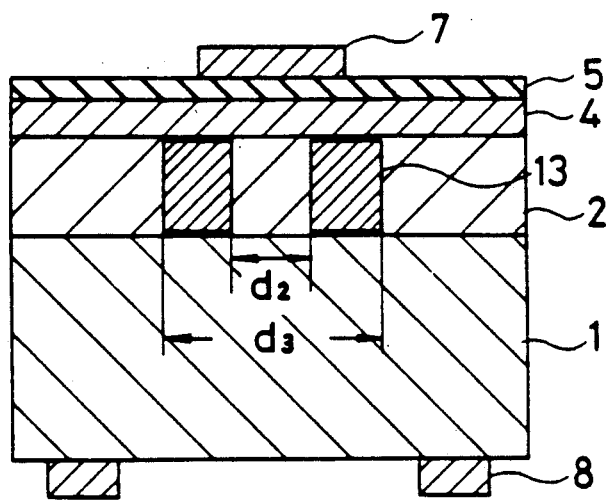
FIGS. 2 to 4 are diagrams showing the structures of second to fourth embodiments of the invention, respectively.

For example when the device (chip) measures 300 $\mu$m × 300 $\mu$m, the second conductive layer may be in the form of a solid cylinder having a diameter d1 of about 30 to about 100 $\mu$m (more preferably 50 $\mu$m) as seen in FIG. 1, or in the form of an annular high-concentration impurity layer having an inside diameter d2 of 15 to 50 $\mu$m and an outside diameter d3 of 50 to 150 $\mu$m as shown in FIG. 2, or may comprise a plurality of minute conductive layer portions, each measuring about 10 $\mu$m × 10 $\mu$m, having a rectangular section and arranged laterally in a row or in the form of a two-dimensional matrix.

Figure 9:
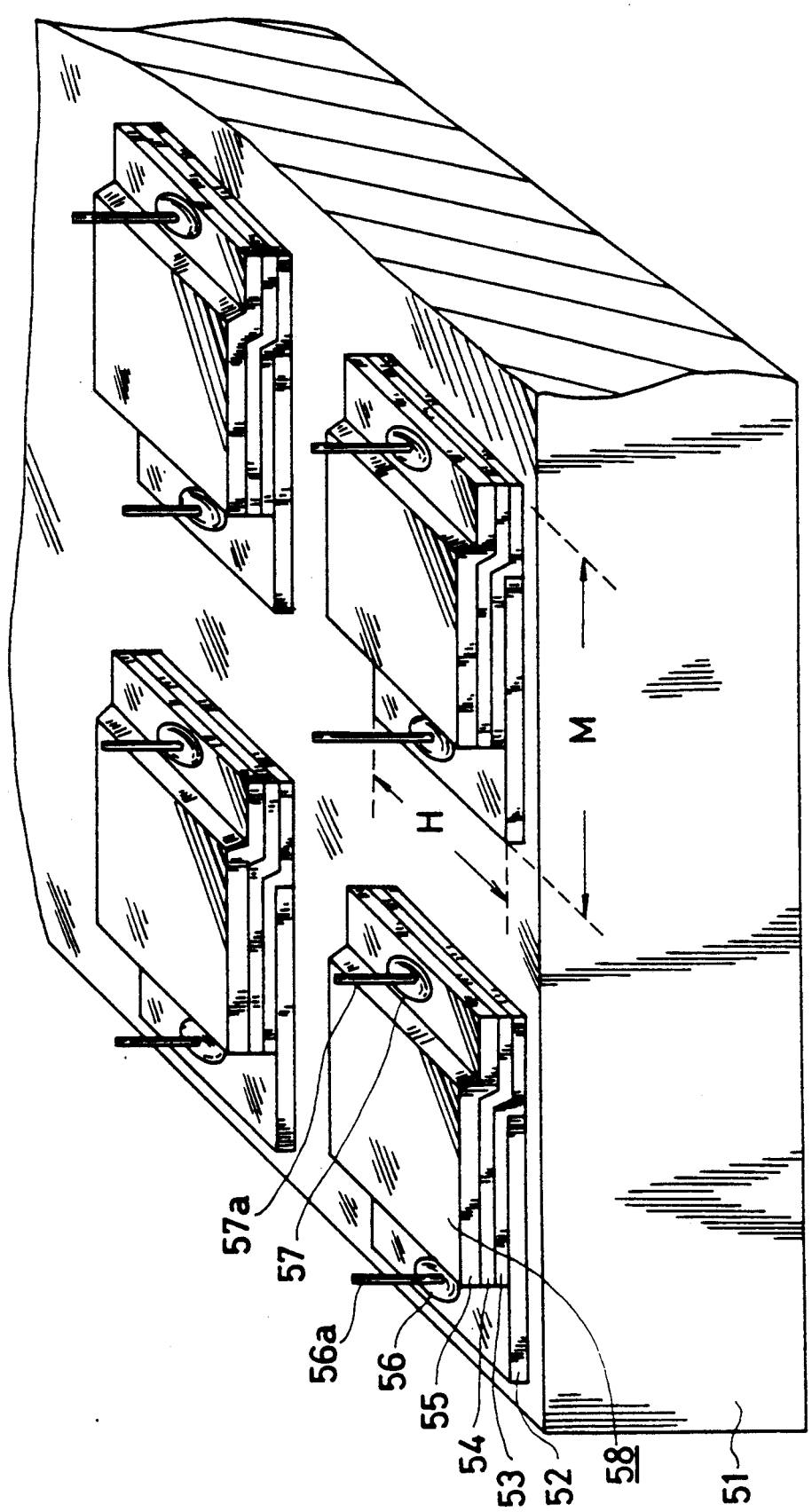
FIG. 9 is a fragmentary perspective view of an electroluminescent display having a large area and incorporating a plurality of electroluminescent devices, each of the devices having a pair of electrodes on its body.
Figure 10:
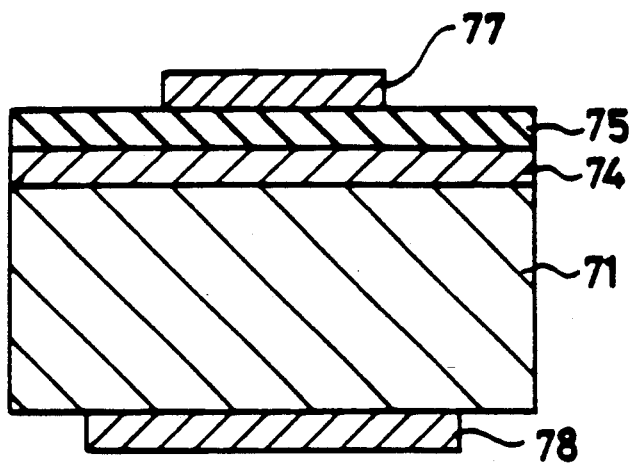
FIGS. 10 and 11 are diagrams showing the structures of conventional devices.
Figure 11:
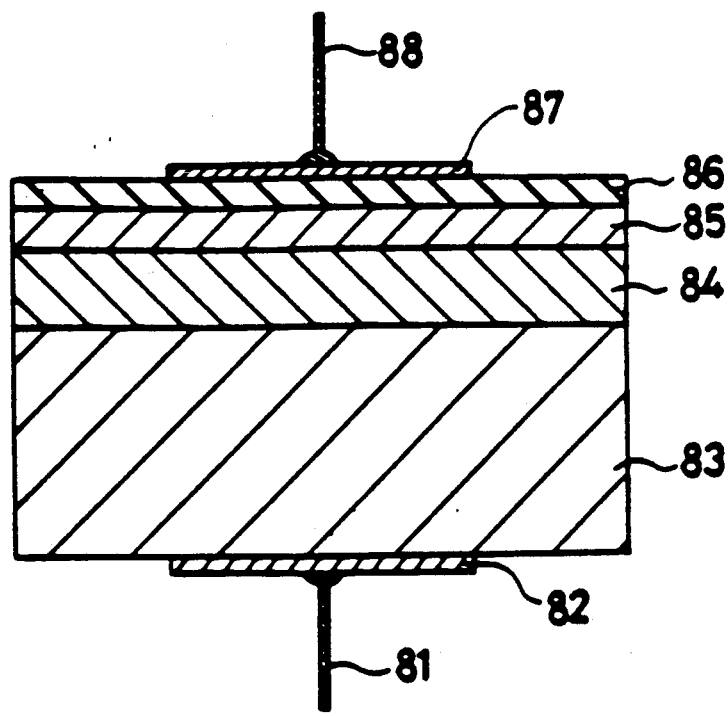

According to the invention, epitaxial compound semiconductor layers are formed one over another on the compound semiconductor substrate to form the body of an electroluminescent device. To be suitable, the device body usually measures 50 to 500 $\mu$m in width, 80 to 800 $\mu$m in length and 2 to 15 $\mu$m in thickness. The device body may be formed singly on the substrate, or a multiplicity of device bodies can be formed in a scattered arrangement to provide a monolithic electroluminescent display or a large-area electroluminescent display. FIG. 9 shows a monolithic electroluminescent display including compound semiconductor electroluminescent devices 58 each having an insulating ZnSe substrate 51, an electroluminescent device body formed on the substrate 51 and comprising a p-type ZnSe conductive layer 52, a p-type ZnSe light-emitting layer 53, an n-type ZnSe light-emitting layer 54 and an n-type ZnSe conductive layer 55 (a conductive layer portion provided in the conductive layer 55 and having a higher n-type impurity concentration than the layer 55 is not shown, but is the same as described hereinafter) which are formed one over another, an Au positive electrode 56 being provided on the conductive layer 52, and an In negative electrode 57 being provided on the conductive layer 55 forming the uppermost layer of the device body. Indicated at 56a and 57a are lead wires. The device 58 on the substrate measures 450 $\mu$m in width H and 750 $\mu$m in length M. The display has 24 × 24 electroluminescent devices as arranged separately from one another in the form of a matrix. An arrangement of such displays provides a large-area electroluminescent display apparatus.

Figure 5:
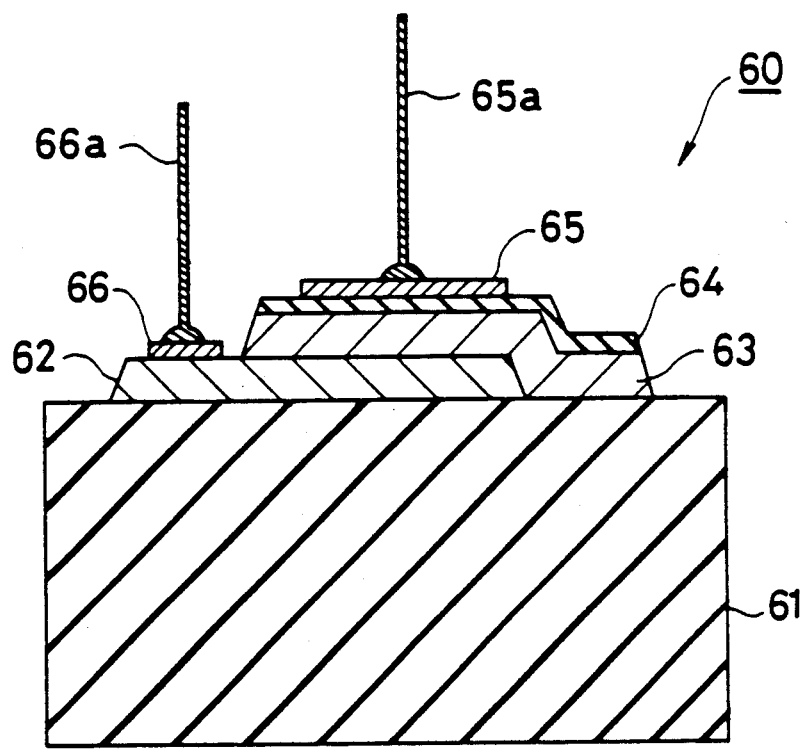
FIGS. 5 and 6 are diagrams showing the structures of electroluminescent devices each having a pair of electrodes on the body of the device.

FIG. 5 shows an MIS-type electroluminescent device 60 having a high-resistance layer formed on a light-emitting layer. More specifically, the device 60 comprises an insulating ZnS substrate 61, a device body formed on the substrate and having an n-type ZnS conductive layer 62 and an n-type ZnS light-emitting layer 63 on the layer 62, a ZnS high-resistance layer 64 formed on the light-emitting layer 63, an Au positive electrode 65 provided on the layer 64, and an In negative electrode 66 provided on the conductive layer 62. Indicated at 65a and 66a are lead wires.

Figure 6:
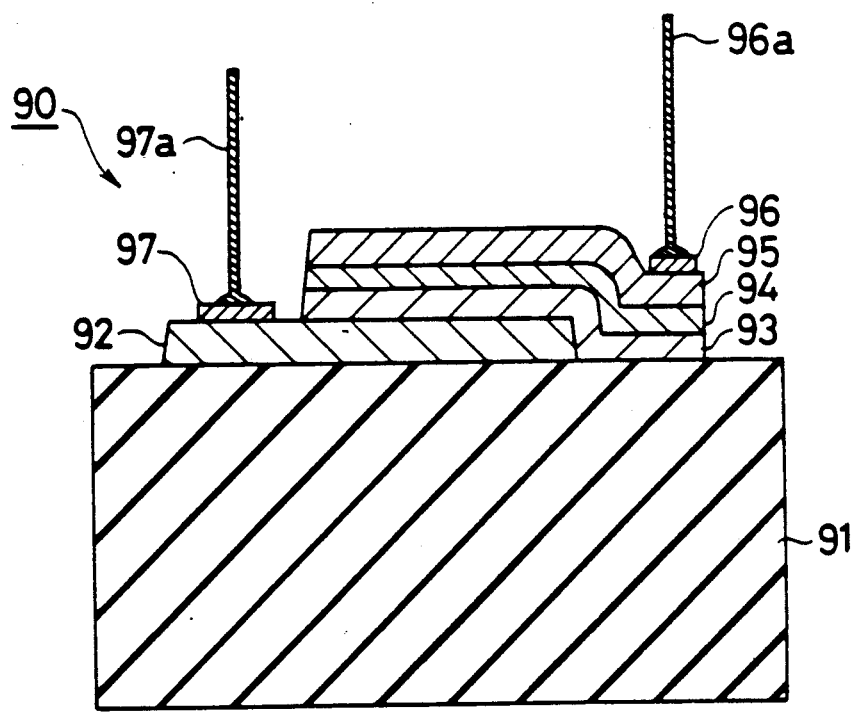

FIG. 6 shows an electroluminescent device 90 of the p-n junction type. The device 90 comprises an insulating ZnSe substrate 91, a device body formed on the substrate and comprising an n-type ZnSe conductive layer 92, an n-type ZnSe light-emitting layer 93, a p-type ZnSe light-emitting layer 94 and a p-type ZnSe conductive layer 95 which are formed one over another, an Au positive electrode 96 provided on the conductive layer 95, and an In negative electrode 97 provided on the conductive layer 92. Indicated at 96a and 97a are lead wires.

With the devices shown in FIGS. 5 and 6, the electrodes 66, 65 or 97, 96, like the electrodes 56, 57 of FIG. 9, are arranged respectively in an electrode forming space on the conductive layer and on the uppermost layer of the device body (on the conductive layer 55 in FIG. 9, on the high-resistance layer 64 in FIG. 5, or on the conductive layer 95 in FIG. 6) for applying a voltage therethrough to the device body.

When the electrodes are thus provided on the device body, the voltage which would otherwise be applied via the substrate can be efficiently applied to the device body. This precludes loss due to the substrate and results in the following advantages.

(1) The reduced resistance between the electrodes makes it possible to provide a compound semiconductor electroluminescent device free of such loss and having high brightness.

(2) Monolithic electroluminescent displays and large-area electroluminescent displays can be provided which comprise a multiplicity of minute electroluminescent chips arranged on a substrate with satisfactory insulation between the chips and reduced series resistance for producing multicolor light including blue light.

Such a compound semiconductor electroluminescent device is fabricated by placing a mask having a specified rectangular aperture on a high-resistance compound semiconductor substrate, for example of $10^6$ to $10^{15}$ ohm-cm, forming a low-resistance semiconductor conductive layer as the lowermost layer first on the substrate, and forming a compound semiconductor light-emitting layer, and a compound semiconductor high-resistance layer or a compound semiconductor conductive layer as superposed layers on the resulting conductive layer except at an electrode forming site. The layers are formed, for example, by MBE. Depending on how the mask is handled, the device is prepared in this way by one of the following two processes.

The first of the processes comprises placing a mask of thin metal film having at least one specified rectangular aperture on the compound semiconductor substrate, epitaxially growing a compound semiconductor conductive layer first as the lowermost layer, then shifting the mask so as to cover the electrode forming site on the layer with the mask, forming a compound semiconductor light-emitting layer on the conductive layer, further epitaxially growing a compound semiconductor high-resistance layer or compound semiconductor conductive layer on the light-emitting layer to obtain a device body, removing the mask and thereafter providing electrodes at the electrode forming sites on the lowermost conductive layer and on the surface of the uppermost high-resistance layer or conductive layer.

The second process comprises placing a mask of thin metal film having at least one specified rectangular aperture over the compound semiconductor substrate at a specified distance (which is usually 10 to 500 $\mu$m to be suitable) away therefrom, epitaxially growing a compound semiconductor conductive layer first, then altering the angle of inclination of the substrate provided with the mask (generally suitably by 5 to 45 degrees) with respect to the direction of projection of the molecular beam to mask an electrode forming site on the conductive layer, forming a compound semiconductor light-emitting layer on the conductive layer, further epitaxially growing a compound semiconductor high-resistance layer or compound semiconductor conductive layer on the resulting layer to obtain a device body, removing the mask and providing electrodes at the electrode forming sites on the lowermost conductive layer and on the surface of the uppermost high-resistance layer or conductive layer.

The electroluminescent device body thus obtained comprises epitaxial compound semiconductor layers which are all identical in shape when seen from above. It is suitable that the electrode forming site on the lowermost layer be usually 5 to 80% of the surface of the lowermost layer in area.

The processes described above are very useful for epitaxially forming compound semiconductor layers. Moreover, the use of a high-resistance compound semiconductor, especially bulk single crystal, as is for the compound semiconductor substrate as already described and shown in FIGS. 9, 5 and 6 facilitates separation of unit electroluminescent devices which are to be obtained collectively in the form of a single chip.

Figure 7:
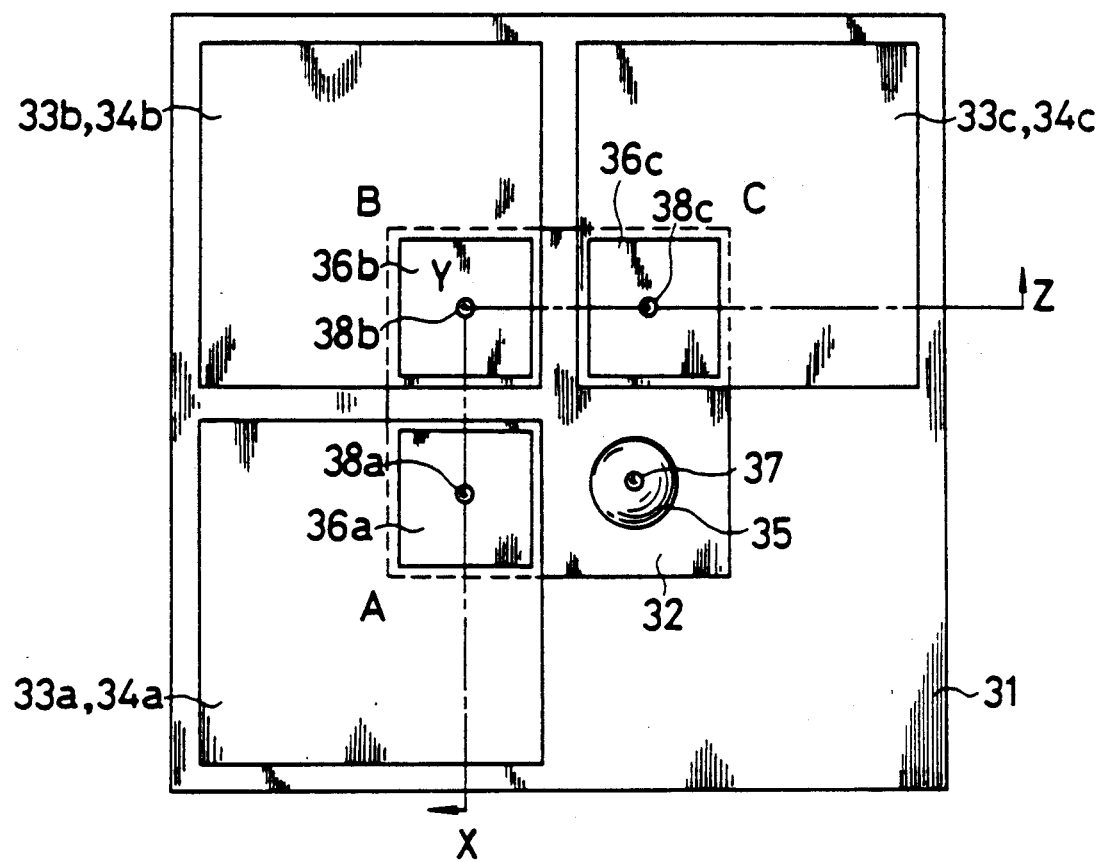
FIG. 7 is a diagram showing the structure of an electroluminescent device having a plurality of electrodes on the body of the device.
Figure 8:
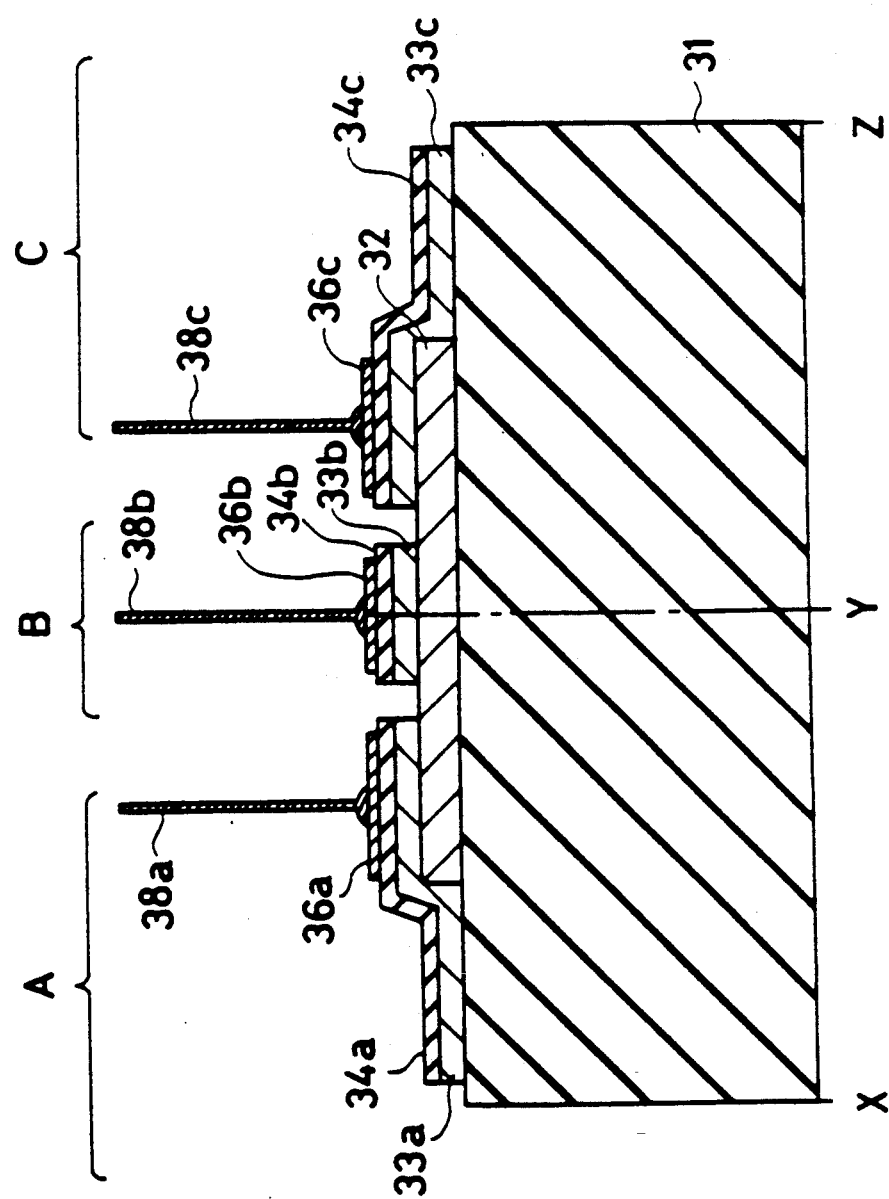
FIG. 8 is a view in section taken along the line X-Y-Z in FIG. 7.

Finally, FIGS. 7 and 8 show a ZnS multicolor electroluminescent device of the MIS type similar to the one shown in FIG. 5. With reference to FIGS. 7 and 8, the device comprises a semi-insulating (high-resistance) ZnS substrate 31, a low-resistance n-type epitaxial ZnS conductive layer 32, low-resistance n-type epitaxial ZnS light-emitting layers 33a, 33b, 33c, hole injecting epitaxial ZnS high-resistance layers 34a, 34b, 34c, an ohmic metal (In) electrode 35 formed on the conductive layer 32, metal (Au) electrodes 36a, 36b, 36c formed on the respective high-resistance layers 34a, 34b, 34c, and metal lead wires 37, 38a, 38b, 38c. This device is prepared by placing a mask of thin metal plate having a rectangular aperture on the semi-insulating (high-resistance) ZnS substrate 31, growing the conductive layer 32 by MBE, thereafter growing the light-emitting layer 33a and the high-resistance layer 34a in overlapping relation with the conductive layer 32 by MBE with the mask shifted to form a light-emitting portion A, similarly forming light-emitting portions B and C in succession with the mask further shifted, and providing the electrodes 35, 36a, 36b and 36c. The device thus formed includes the three light-emitting portions A, B and C having the conductive layer 32 in common. The light-emitting layers of the respective light-emitting portions have added thereto as impurities Al and Ag at about one-tenth the concentration of Al, Al and Cu at about one-tenth the concentration of Al, and Al and cadmium (Cd) at one-half the concentration of Al, respectively.

When voltage was applied to the respective light-emitting portions of the device obtained, blue, green and red luminescences were observed with high brightness. Multicolor light was produced by controlling the voltage applied to the three light-emitting portions.

According to the present invention, the second conductive layer is formed during the growth of the first conductive layer by locally irradiating the grown layer, for example with an ArF excimer laser beam at a wavelength of 193 nm, whereby impurities are added at a high concentration to the irradiated portion of the grown layer, consequently forming a region having an impurity concentration which is greater than that of the non-irradiated portion by about one order of magnitude. This region provides the second conductive layer.

With reference to FIG. 1, indicated at 1 is a low-resistance n-type ZnS substrate having a resistivity of 1 ohm-cm, at 2 a first conductive layer of low-resistance n-type ZnS, at 3 a second conductive layer of low-resistance n-type ZnS having a higher impurity concentration than the first conductive layer 2, at 4 an n-type ZnS light-emitting layer, at 5 a hole injecting insulating layer of insulating ZnS, at 7 a positive electrode and at 8 a negative electrode.

The first conductive layer 2, the light-emitting layer 4 and the hole injecting insulating layer 5 of this device are single-crystal semiconductor layers which are epitaxially grown one over another on the substrate 1 by MBE.

The second conductive layer 3 having a higher impurity concentration than the first conductive layer 2 is formed during the growth of the first conductive layer 2 by locally irradiating the surface of the layer 2 being grown with a beam (for example an ArF excimer laser beam at a wavelength of 193 nm). When the layer is grown while being irradiated with light, impurity elements are added to the irradiated portion to a high concentration, whereby a region is formed with an impurity concentration which is about one order of magnitude higher than that of the non-irradiated portion. The first conductive layer 2 was 5 $\mu$m in thickness and $10^{18}$ cm$^{-3}$ in impurity concentration. The second conductive layer 3 was formed over almost the entire thickness of the first conductive layer 2 and was given by the above growth method an impurity concentration of about $10^{19}$ cm$^{-3}$, i.e. about 10 times that of the first conductive layer 2. In this case, the first conductive layer 2 was $5 \times 10^{-2}$ ohm-cm, and the second conductive layer $3.5 \times 10^{-3}$ ohm-cm in resistivity.

For the second conductive layer 3 to fully confine the current, the layer 3 is made to have a diameter d1 of about 50 $\mu$m when the device (chip) is, for example, 300 $\mu$m $\times$ 300 $\mu$m in size. The light-emitting layer 4 was given a thickness of 2 $\mu$m and an impurity concentration of $10^{17}$ cm$^{-3}$. The hole injecting insulating layer 5 was formed to a thickness of 20 to 700 angstroms.

The hole injecting insulating layer 5 was prepared from insulating ZnS which was grown in the absence of any impurity element or with the addition of both the above-mentioned n-type impurity elements and a p-type impurity element from Group V such as nitrogen (N), phosphorus (P), arsenic (As) or antimony (Sb).

The positive electrode 7 was formed by depositing gold (Au) on the insulating layer 5 at the position immediately above the second conductive layer 3 to a thickness of 500 to 1000 angstroms by vacuum evaporation. The negative electrode 8 is an ohmic electrode formed by coating the entire rear surface of the substrate 1 with indium-mercury (In-Hg) and heating the coating in high-purity hydrogen (H$_2$) at about 400° C. for 30 seconds.

With the ZnS electroluminescent device of the MIS type described above, the path of current flow through the first conductive layer 2 is restricted to the second conductive layer 3 having a higher impurity concentration and lower resistivity than the layer 2, permitting injection of the current into the light-emitting layer 4 at a high density. A blue luminescence with 5 to 10 times the brightness achieved by conventional MIS-type ZnS electroluminescent devices was observed through the positive electrode 7, insulating layer 5 and device end face.

FIG. 2 shows another ZnS electroluminescent device of the MIS type as a second embodiment which has substantially the same structure as the above embodiment except that the second conductive layer of high impurity concentration is in the form of a ring. With reference to the drawing, the device includes a substrate 1, first conductive layer 2, light-emitting layer 4 and insulating layer 5 which are similar to those of the above embodiment. The second conductive layer, indicated at 13, is an annular layer having a high impurity concentration, measuring 30 μm in inside diameter d2 and 100 μm in outside diameter d3, and formed by irradiating the first conductive layer 2 with an ArF laser beam in the form of a ring while the layer 2 is being grown. This embodiment is generally the same as the first embodiment described above in respect of the thicknesses of the layers and impurity concentration. As the positive electrode 7, an Au electrode, 30 to 100 μm in diameter, was formed by vacuum evaporation on the insulating layer 5 at the position immediately above the second conductive layer 13. An ohmic electrode of In-Hg was formed in an annular shape on the rear side of the substrate 1 as the negative electrode 8.

The path of current flow into the light-emitting layer 4 is restricted by the second conductive layer 13 also in this case to give a blue luminescence with high brightness. Since the second conductive layer 13 with a high impurity concentration is lower than the first conductive layer 2 in refractive index, the light produced by the light-emitting portion positioned between the second conductive layer 13 and the positive electrode 7 on the light-emitting layer 4 was confined in the portion of the first conductive layer 2 surrounded by the annular second conductive layer 13 and having a higher refractive index. Consequently, the light was delivered efficiently from the device through the rear surface of the substrate 1 without leaking from the end faces of the device.

Thus, the present embodiment realizes an MIS-type ZnS electroluminescent device which delivers light with a high efficiency and high brightness.

Figure 3:
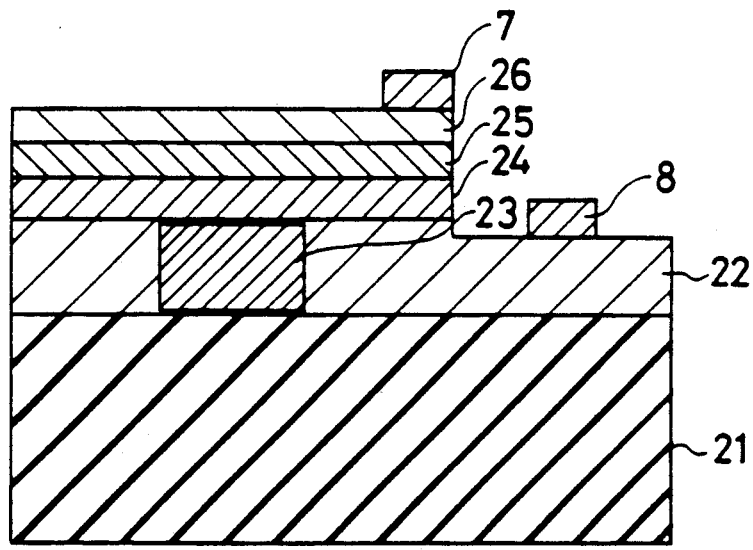

FIG. 3 shows another electroluminescent device as a third embodiment of the invention. With reference to the drawing, indicated at 21 is an insulating ZnSe substrate, at 22 a first conductive layer of low-resistance n-type ZnSe, at 23 a second conductive layer of n-type ZnSe having a higher impurity concentration than the first conductive layer 22, at 24 an n-type ZnSe light-emitting layer, at 25 a p-type ZnSe light-emitting layer, at 26 a conductive layer of low-resistance p-type ZnSe, at 7 a positive electrode, and at 8 a negative electrode.

The insulating ZnSe substrate 21 used for the device was prepared from a ZnSe bulk single crystal grown by the halogen chemical transport process, sublimation process or high-pressure melting process without treating the crystal for a reduction of resistance. The semiconductor layers were epitaxially grown on the substrate 21 in succession by MBE. The conductive layers 22, 23 and light-emitting layer 24 of n-type ZnSe were generally the same as those of the first embodiment in shape, size and characteristics. Over the layer 24 were formed the light-emitting layer 25 of p-type ZnSe with a thickness of 2 μm and hole concentration of $5 \times 10^{16}$ cm$^{-3}$, and the conductive layer 26 of low-resistance p-type ZnSe having a thickness of 5 μm and hole concentration of $5 \times 10^{17}$ cm$^{-3}$. The positive electrode 7 was formed by depositing Au on an end portion of the p-type ZnSe conductive layer 26 by vacuum evaporation. The negative electrode 8 was formed by locally removing the grown layers, for example by chemical etching or reactive ion beam etching (RIE) and depositing In by vacuum evaporation on the exposed surface of the first conductive layer 22 of n-type ZnSe to obtain a ZnSe p-n junction electroluminescent device having a planar structure.

Examples of p-type impurity elements useful for the light-emitting layer 25 and the conductive layer 26 which are made of p-type ZnSe are elements from Group Ia such as lithium (Li), sodium (Na) and potassium (K), copper (Cu), silver (Ag) and gold (Au) from Group Ib, thallium (Tl) in Group III, elements in Group V such as nitrogen (N), phosphorus (P), arsenic (As), antimony (Sb) and bismuth (Bi), etc.

With the positive electrode 7 formed at the end of the p-type ZnSe conductive layer 26, light was efficiently delivered from the upper portion of the device. When the substrate 21 used was made of a colorless transparent insulating ZnSe single crystal grown by the sublimation process, it was possible to deliver the light also from the substrate side with high brightness.

In the case of the present device also, the path of current flow through the light-emitting layers 24, 25 is restricted to the portion thereof immediately above the second conductive layer 23 having a high impurity concentration and low resistivity. The device produced light with brightness 5 to 10 times as high as is the case with conventional devices at approximately the same current value.

The planar structure including the insulating substrate 21 obviates the need for low-resistance treatment of the substrate crystal, greatly simplifies the device fabrication process and decreases the device resistance to diminish the loss involved.

The present embodiment realizes high-brightness p-n junction electroluminescent devices.

Figure 4:
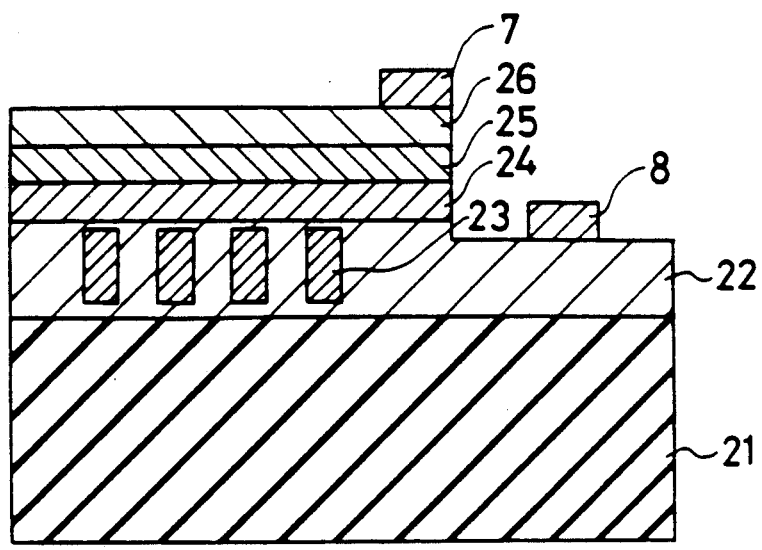

FIG. 4 shows another ZnSe p-n junction electroluminescent device as a fourth embodiment of the invention.

Basically, this embodiment has the same construction as the third embodiment except that the first conductive layer 22 of low-resistance n-type ZnSe has formed therein a plurality of second conductive layers 23 made of low-resistance n-type ZnSe having a higher impurity concentration than the first conductive layer 22.

In this case, the flow of current is restricted at the positions of the individual second conductive layers 23 to produce light with high brightness. A plurality of rectangular second conductive layers 23, as small as about 10 μm×10 μm, were provided in the desired arrangement, whereby a high-brightness luminescence was obtained in a pattern corresponding to the arrangement of the second conductive layers 23.

Using the p-n junction electroluminescent device of monolithic structure according to the present embodiment, it was possible to produce light with high brightness in a desired configuration by altering the distribution of second conductive layers having different impurity concentrations.

According to the first to fourth embodiments described above in detail, the semiconductor conductive layer of the p-n junction or MIS electroluminescent device comprises conductive layer portions with different impurity concentrations, so that the current through the device is confined in the conductive layer portion having the higher impurity concentration and lower resistivity, permitting injection of the current into the light-emitting layer at a high density. Furthermore, a difference in the impurity concentration produces a difference in the refractive index of the conductive layer. As will be apparent from the foregoing second and fourth embodiment, therefore, the light produced by the light emitting layer can be efficiently delivered from the device by confining the light in the first conductive layer having a higher refractive index than the second conductive layer when these layers are suitably desired. This realizes compound semiconductor electroluminescent devices which are adapted to deliver light with high efficiency and high brightness and which are very useful as light sources for various optoelectronic apparatus such as high-brightness blue electroluminescent displays.

What is claimed is:

1. An electroluminescent device of compound semiconductor, comprising an electroluminescent device body formed on a substrate and including a light-emitting portion having an upper surface and a lower surface, a conductive portion joined to at least one of the lower surface and the upper surface of said light-emitting portion, and a pair of electrodes for applying an external voltage to the body through said light-emitting and conductive portions to cause electroluminescence, said conductive portion comprising a conductive layer formed of a Group II-II compound semiconductor fabricated so as to have a substantially low resistance by addition thereto of an impurity element at a first concentration, and a conductive layer part located in the conductive layer and formed of the Group II-VI compound semiconductor and having an impurity element added thereto at a second concentration higher than said first concentration of the conductive layer, said conductive layer part having a width selected so as to define a restricted current flow path through said light-emitting portion.

2. A device as defined in claim 1 wherein the Group II-VI compound semiconductor forming the conductive layer and the conductive layer part is ZnS, ZnSe or $ZnS_ySe_{1-y}$, and the conductive layer and the conductive layer part contain the same impurity element.

3. A device as defined in claim 1 wherein the substrate is made of a conductive ZnS, ZnSe or $ZnS_xSe_{1-x}$.

4. A device as defined in claim 1 wherein the substrate is made of an insulating ZnS, ZnSe or $ZnS_xSe_{1-x}$.

5. A device as defined in claim 1 wherein the light-emitting portion is a luminescent layer of the MIS (metal insulator semiconductor) type formed of ZnS or ZnSe having an impurity element added thereto.

6. A device as defined in claim 1 wherein the light-emitting portion is a luminescent layer of planar structure having a p-n junction formed by the combination of ZnS having a p-type impurity element added thereto and ZnS having an n-type impurity element added thereto.

7. A device as defined in claim 1 wherein the light-emitting portion is a luminescent layer of planar structure having a p-n junction formed by the combination of ZnSe having a p-type impurity element added thereto and ZnSe having an n-type impurity element added thereto.

8. A device as defined in claim 1 wherein the conductive layer part is in the form of a solid cylinder.

9. A device as defined in claim 1 wherein the conductive layer part is in the form of a ring and has a smaller refractive index than the conductive layer.

10. A device as defined in claim 1 wherein the conductor layer part comprises a plurality of segments having a rectangular section and arranged laterally in a row at a spacing and has a smaller refractive index than the conductive layer.

11. A device as defined in claim 1 wherein the conductive portion and the light-emitting portion are identical in shape when seen in a plane view, and the conductive layer having the conductive layer part is formed on the substrate, the light-emitting portion being formed on the conductive layer and on the substrate with an electrode forming space left locally on the upper surface of the conductive layer, the pair of electrodes being connected to the conductive layer and the light-emitting portion respectively.

12. A device as defined in claim 7 or 11 wherein the substrate is an insulating substrate of ZnSe, and the device body comprises a conductive layer of ZnSe having an n-type impurity element added thereto and a conductive layer part of ZnSe with an n-type impurity element added thereto, a light-emitting layer of ZnSe having an n-type impurity element added thereto, a light-emitting layer of ZnSe having a p-type impurity element added thereto, and a conductive layer of ZnSe having a p-type impurity element added thereto, the component layers of the device body being formed on the substrate one over another in the order mentioned, one of the electrodes being made of Au and provided on the uppermost conductive layer, the other electrode being made of In and provided on the lowermost conductive layer.

13. A device as defined in claim 1 wherein one of the electrodes is connected to the device body, and the other electrode is connected to one surface of the substrate opposite to the other surface thereof having the device body formed thereon.

14. A device as defined in claim 5 or 13 wherein the substrate is made of ZnS having an n-type impurity element added thereto, and the device body comprises a conductive layer of ZnS containing an n-type impurity element added thereto and having a conductive layer part of ZnS with an n-type impurity element added thereto, a light-emitting layer of ZnS having an n-type impurity element added thereto and an insulating layer of ZnS, the component layers of the device body being formed on the substrate one over another in the order mentioned, one of the electrodes being made of Au and provided on the insulating layer, the other electrode being made of In and provided on one surface of the substrate opposite to the other surface thereof having the device body formed thereon.

15. A device as defined in claim 1 wherein the light-emitting portion is a luminescent layer of planar structure having a p-n junction formed by the combination of $ZnS_xSe_{l-x}$ having a p-type impurity element added thereto and $ZnS_ySe_{l-y}$ having an n-type impurity element added thereto.

16. A device as defined in claim 1 wherein the light-emitting portion is a luminescent layer of planar structure having a p-n junction formed by the combination of $ZnS_xTe_{l-x}$ having a p-type impurity element added thereto and $ZnS_yTe_{l-y}$ having an n-type impurity element added thereto.

* * * * *